(12) United States Patent
Wang et al.

(10) Patent No.: US 7,803,647 B2
(45) Date of Patent: Sep. 28, 2010

(54) OPTICAL TRANSMISSION IMPROVEMENT ON MULTI-DIELECTRIC STRUCTURE IN ADVANCE CMOS IMAGER

(75) Inventors: Wen-De Wang, Chiayi County (TW); Dun-Nian Yaung, Taipei (TW); Tzu-Hsuan Hsu, Kaohsiung (TW); Shine Chung, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 143 days.

(21) Appl. No.: 11/672,681

(22) Filed: Feb. 8, 2007

(65) Prior Publication Data

US 2008/0191296 A1 Aug. 14, 2008

(51) Int. Cl.
*H01L 21/00* (2006.01)

(52) U.S. Cl. .......... 438/48; 257/414; 257/431; 257/432; 257/440; 257/758; 257/E27.131; 257/E31.121; 257/E31.125; 438/54; 438/64; 438/65; 438/69

(58) Field of Classification Search .......... 257/432, 257/440, 758, E27.131, E31.121, 125; 438/48, 438/54, 64, 65, 70
See application file for complete search history.

(56) References Cited

U.S. PATENT DOCUMENTS

| | | | |
|---|---|---|---|
| 6,468,826 B1 * | 10/2002 | Murakami et al. | 438/48 |
| 2005/0001146 A1 * | 1/2005 | Quinlan | 250/214.1 |
| 2005/0088551 A1 * | 4/2005 | Lee et al. | 348/272 |
| 2005/0236553 A1 * | 10/2005 | Noto et al. | 250/208.1 |
| 2006/0138480 A1 * | 6/2006 | Adkisson et al. | 257/291 |

* cited by examiner

*Primary Examiner*—Thao X Le
*Assistant Examiner*—Eric W Jones
(74) *Attorney, Agent, or Firm*—Haynes and Boone, LLP

(57) ABSTRACT

The present disclosure provides an image sensor semiconductor device. The semiconductor device includes a sensor element disposed in a semiconductor substrate; an inter-level dielectric (ILD) disposed on the semiconductor substrate; and a trench disposed in the ILD, overlying and enclosing the sensor element, and filled with a first dielectric material.

26 Claims, 4 Drawing Sheets

OPTICAL TRANSMISSION IMPROVEMENT ON MULTI-DIELECTRIC STRUCTURE IN ADVANCE CMOS IMAGER

BACKGROUND

Image sensors are integrated circuit devices that include a plurality of sensor elements, or pixels, formed in a semiconductor substrate. The sensor elements are used for sensing a volume of exposed light projected towards the semiconductor substrate. As with many types of integrated circuits, a desire exists to advance image sensors as semiconductor technology develops. A common development in semiconductor technology is the adoption of copper in one or more conductive layers. For example, interconnect metal in advanced semiconductor technology uses copper, which add various etch stop layers and barrier layers between inter-metal dielectric layers to prevent the copper from migrating to nearby silicon oxide dielectric material. Silicon nitride has been widely used as barrier layer and stop layer. However, different indexes of refraction between silicon nitride and silicon oxide will cause optical interference, and this will result in a modification or degradation of the image sensor's performance.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
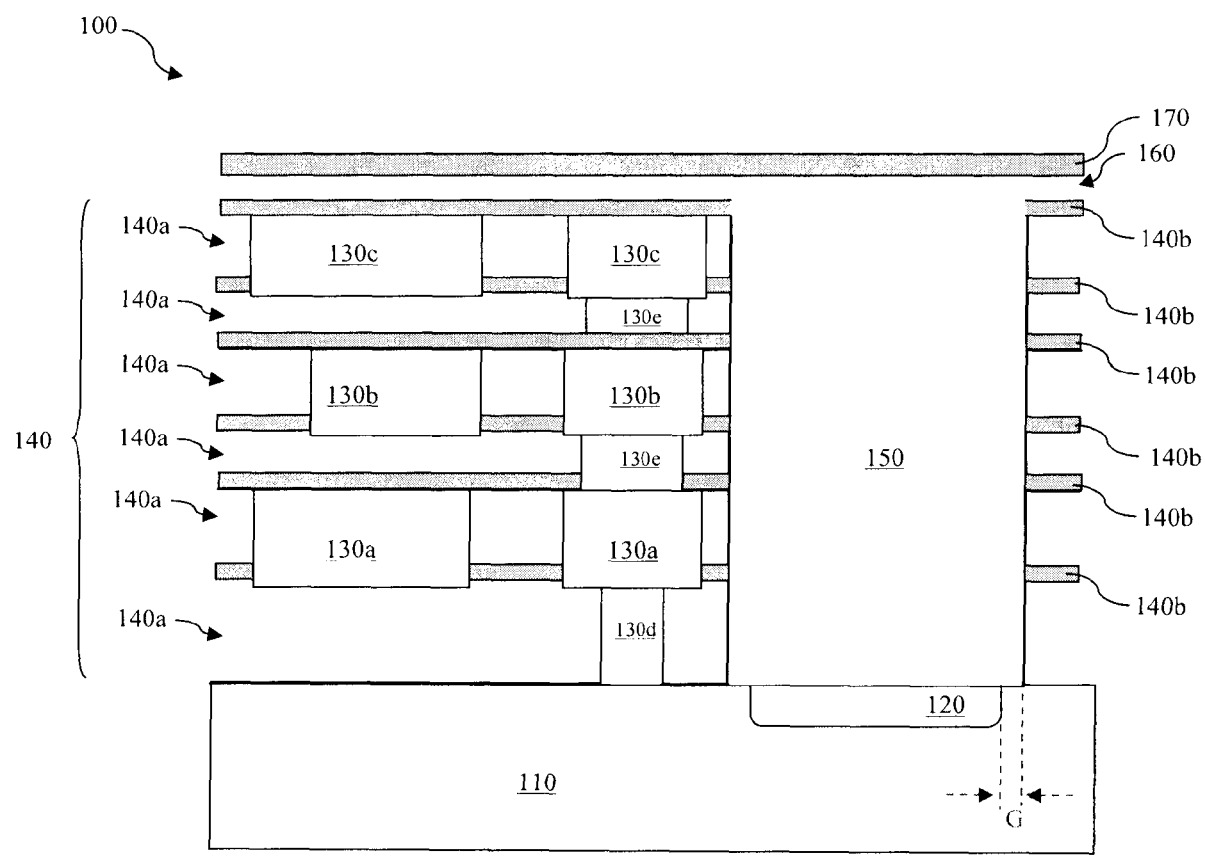
FIG. 1 illustrates a sectional view of one embodiment of a semiconductor device constructed according to aspects of the present disclosure.

It is to be understood that the following disclosure provides many different embodiments, or examples, that may benefit from the present invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 2:
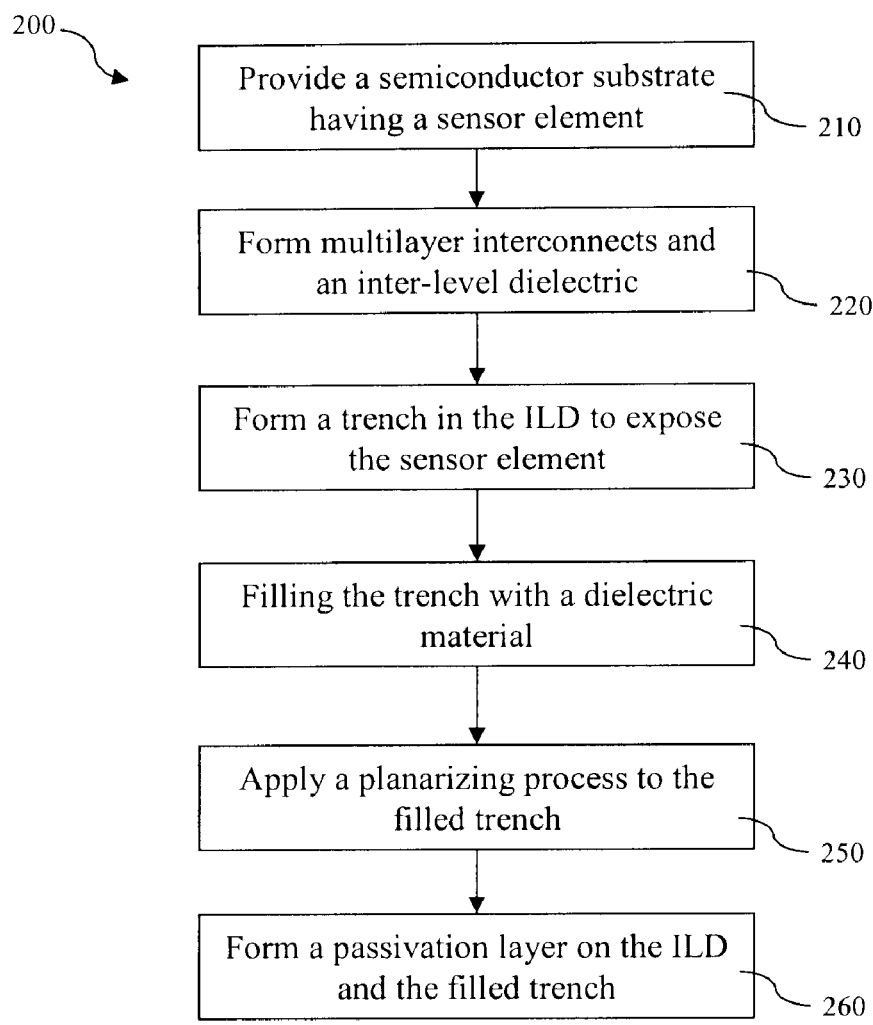
FIG. 2 illustrates a flowchart of one embodiment of a method to fabricate the semiconductor device of FIG. 1 constructed according to aspects of the present disclosure.

A semiconductor device 100 having an image sensor element and a method 200 of making the same will be described below with reference to FIGS. 1 and 2, respectively. FIG. 1 is a sectional view of one embodiment of the semiconductor device 100 and FIG. 2 is a flowchart of the method 200 in one embodiment.

The method 200 begins at step 210 by providing a semiconductor substrate 110 having an imaging sensor 120 formed therein. The substrate 110 includes silicon in a crystalline structure. The substrate 110 may alternatively or additionally include other elementary semiconductor such as germanium, or diamond. The substrate 110 may also include a compound semiconductor such as silicon carbide, gallium arsenic, indium arsenide, or indium phosphide. The substrate 110 may include various p-type doped regions and/or n-type doped regions configured and coupled to form various devices and functional features. All doping features may be achieved using a process such as ion implantation or diffusion in various steps and techniques. The substrate 110 may include other features such as a shallow trench isolation (STI), an epi layer, a semiconductor on insulator (SOI) structure, or combinations thereof.

The imaging sensor element 120 is disposed in the semiconductor substrate 110. The sensor element 120 includes a light-sensing region which may be a doped region having N-type and/or P-type dopants formed in the semiconductor substrate 110 by a method such as diffusion or ion implantation. The light-sensing region may have a doping concentration ranging between about $10^{14}$ and $10^{21}$ atoms/cm$^3$. The light-sensing region may have a surface area ranging between about 10% and 80% of the area of the associated sensor element, being operable to receive light (or other form of radiation energy from an object to be imaged). Examples of the sensor element 120 include a photodiode, a complimentary metal-oxide-semiconductor (CMOS) image sensor, a charged coupling device (CCD) sensor, an active sensor, a passive sensor, and/or other types of devices diffused or otherwise formed in the substrate 110. As such, the sensor element 120 may include conventional and/or future-developed image sensing devices.

The sensor element 120 is provided here only for example. The semiconductor device 100 may include a plurality of sensor elements disposed in an array or other proper configuration. The plurality of sensor elements may be designed to have various sensor types. For example, one group of sensor elements may be CMOS image sensors and another group of sensor elements may be passive sensors. Moreover, the sensor elements 120 may include color image sensors and/or monochromatic image sensors.

The method 200 proceeds to step 220 by forming a multilayer interconnect (MLI) 130 and an inter-level dielectric (ILD) 140 on the semiconductor substrate 110. MLI 130 is coupled to the sensor element 120 and other electric units formed in the semiconductor substrate 110. FIG. 1 illustrates an exemplary MLI structure with three metal layers. MLI 130 includes various metal features such as metal one 130a, metal two 130b, and metal three 130c. MLI 130 further includes contact features 130d configured between metal one 130a and the semiconductor substrate and coupling the both. MLI 130 further includes vias 130e each configured between adjacent metal layers and coupling the both. For example, the vias 130e may be disposed between metal one 130a and metal two 130b, and disposed between metal two 130b and metal three 130c. Each of metal features 130a, 130b, 130c, 130d and 130e may have a critical dimension substantially less than 0.25 micron. MLI 130 includes copper. MLI 130 may alternatively or collectively include other conductive materials such as copper alloy, titanium, titanium nitride, tantalum, tantalum nitride, tungsten, polysilicon, metal silicide, or combinations.

The metal silicide may include nickel silicide, cobalt silicide, tungsten silicide, tantalum silicide, titanium silicide, platinum silicide, erbium silicide, palladium silicide, or combinations thereof.

The multilayer interconnect may be formed by a technique such as CVD, sputtering, plating, other suitable processes, or combinations thereof. For example, PVD may be used to form a copper seed layer and then a plating process may be employed to deposit more copper for interconnection. The three metal layers in FIG. 1 are only for example and simplicity. In various embodiments, MLI 130 may include less or more than three metal layers. MLI 130 is designed and disposed without blocking the sensor element 120 from imaging light.

ILD 140 is disposed on the semiconductor substrate 110 to electrically isolate MLI 130. ILD 140 may include a pre-metal dielectric layer (PMD) and various inter-metal dielectric layers (IMD) 140a and various etch stop/barrier layers (or referred to as a barrier layer for simplicity) 140b interposed between adjacent IMD 140a. Each of PMD and IMD layers 140a may have a thickness ranging between about 0.1 micron and 1 micron. In one instance, PMD has a thickness ranging between about 3500 and about 7000 Angstrom. The IMD layer between the via one and via two has a thickness ranging between about 1000 and about 4000 Angstrom. The IMD layer between the metal one and metal two has a thickness ranging between about 1000 and about 5000 Angstrom. IMD 140a at higher metal level may have a greater thickness. IMD and PMD 140a may include silicon dioxide such as undoped silica glass (USG), silicon nitride, silicon oxynitride, polyimide, spin-on glass (SOG), fluoride-doped silicate glass (FSG), carbon doped silicon oxide such as SiCOH, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), and/or other suitable materials. The barrier layer 140b may provide etch stop function utilized during damascene process, barrier function to eliminate moisture diffusion to MLI 130 and copper migration to the ILD 140. The barrier layer 140b may include silicon nitride, silicon oxynitride, silicon carbide, or other suitable material. ILD 140 (including 140a and 140b) may be formed by a technique including spin-on, CVD, sputtering, or other suitable processes. For example, plasma enhanced (PE) CVD may be utilized to form silicon oxide from silane ($SiH_4$) or tetraethoxysilane (TEOS). In another example, high density plasma (HDP) CVD may be utilized.

MLI 130 and ILD 140 may be formed in an integrated process referred to as a damascene process such as a dual damascene process or a single damascene process. In one example, each of a metal layer, via, and contact may be formed by a processing flow described below. An etch stop and/or barrier layer is first formed on the semiconductor device 100. The etch stop lay may include silicon nitride or silicon oxynitride. A dielectric material is deposited on the etch stop layer to form a dielectric layer and may be further planarized by a process such as a chemical mechanical planarizing (CMP) process or an etch back process. A CMP stop layer may be formed on the dielectric layer. The dielectric layer is then etched to form a trench (such as 130e through 130a) according to pre-designed circuit pattern by a photolithography process. A lining layer for barrier and/or adhesion is deposited in the trench by a method such as sputtering. Copper is then filled in the lined trench by a sputtering process to form a copper seed layer and a plating process to form copper filling. Then copper formed on the dielectric layer may be removed and the semiconductor device 100 be planarized by a CMP or etch back process. Alternatively, MLI 130 and ILD 140 may be formed by a dual damascene process in various embodiments known in the art. In some embodiments, dummy metal features may be formed at step 220 along with the MLI 130. For example, dummy metal features may be formed in the regions over the sensor element 120 for tuning pattern density and enhancing CMP performance. The dummy metal features can be removed during trench formation at next step.

Figure 3:
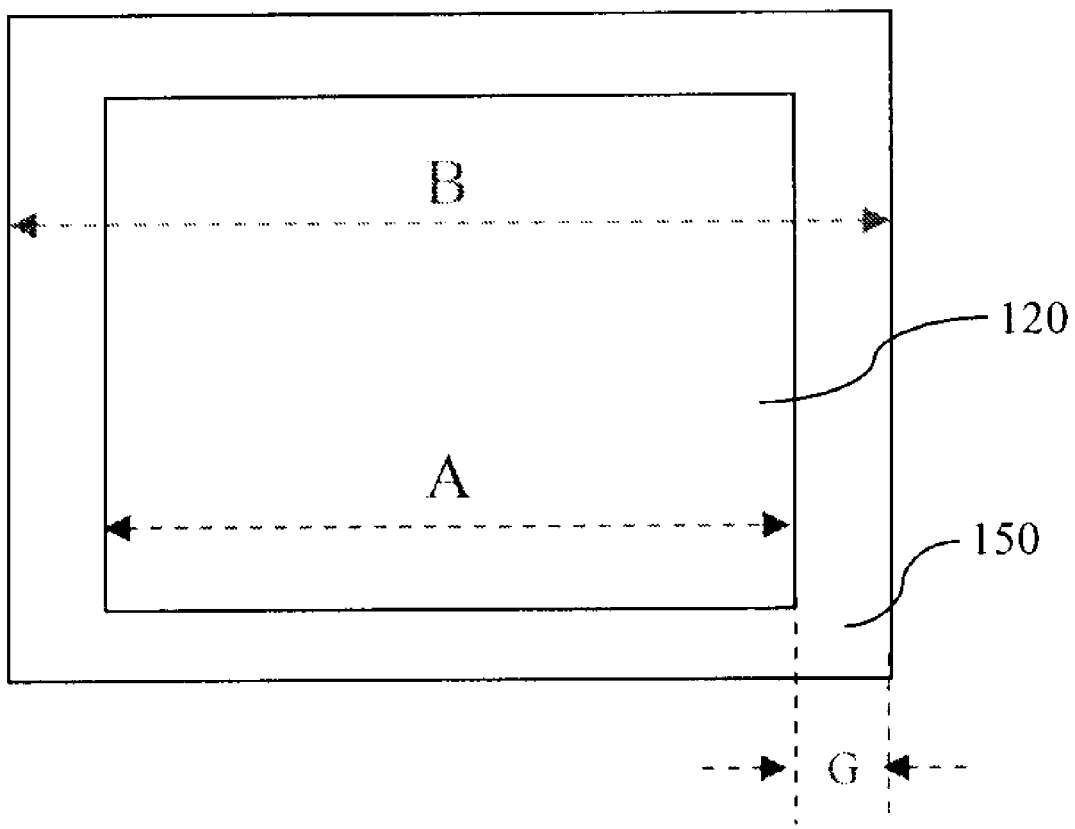
FIG. 3 illustrates a top view of one embodiment of the semiconductor device of FIG. 1 constructed according to aspects of the present disclosure.

The method 200 may proceed to step 230 by forming a trench (an opening) 150 in the ILD 140. The trench 150 is defined and disposed such that the sensor element 120 is exposed. The trench 150 has a depth extended to the surface of the sensor element 120. In other embodiment, the trench 150 is not extended to the surface of the sensor element 120 and a portion of the ILD 140 remains interposed between the trench 150 and the sensor element 120 (not shown). The trench 150 has horizontal dimensions in a top view to substantially enclose the sensor element 120. For example, as additionally illustrated in FIG. 3 as a top view of the sensor element 120 and the trench 150, the trench 150 has outlines enclosing the sensor element 120 inside. The sensor element 120 and the trench 150 each has a dimension labeled as A and B. The dimension A of the sensor element 120 may have a range between about 0.5 micron to 5 micron. The dimension B of the trench 150 may have a similar range but with an offset to substantially enclose the sensor element. The trench 120 is designed and positioned such that the outline of the trench has a gap, labeled as 'G', to various edges of the sensor element 120. The gap G may be about 0.1 micron or more. The trench 150 may be formed by a processing flow including lithography patterning and etching. For example, a photoresist layer is applied to ILD 140 and is patterned to have an opening by a lithography process. Then the ILD 130 is etched through the opening of the patterned photoresist to expose the sensor element 120, resulting in the trench 150. The etching process may employ a dry etching technique, and utilize a carbon fluorine based etchant and oxygen gas. In various embodiments, the carbon fluorine based etchant may include $CF_4$, $CHF_3$, $C_2F_6$, $C_3F_8$, $C_4F_8$, or combinations thereof. The dry etching process may have a processing temperature ranging between about 100 and 150 degree. Alternatively, the etching process may employ a wet etching technique, utilizing a hydrofluoric acid (HF)-based etchant. The etching process may be monitored and controlled to eliminate over etching to the semiconductor substrate 110 and the sensor element 120 formed therein. In another embodiment, an etching stop layer may be formed on the semiconductor substrate 110 before the formation of MLI 130 and ILD 140. Thus the etching process will stop on the etch stop layer. The etch stop layer in the trench may be removed by other etching process to expose the underlying sensor element 120. In another embodiment, a mask layer may be utilized in forming the trench 150 in ILD 140. For example, a mask layer is applied to ILD 140. A photoresist layer is applied on the mask layer and patterned to form an opening by a lithography process. The mask layer is then etched to transfer the opening from the photoresist layer to the mask layer. The photoresist layer is removed by a wet stripping or a plasma ashing thereafter. Then ILD 140 is etched through the opening of the mask layer to form the trench 150 and expose the sensor element 120 in the semiconductor substrate 110.

The method 200 proceeds to step 240 by filling the trench 150. The trench 150 is substantially filled with a dielectric material transparent to light from an object to be imaged toward the sensor element. The light may be a visible light and have a wavelength ranging from about 300 to 800 nm.

Additionally, in one embodiment, the dielectric material filled in the trench 150 has a refractive index high than that of the surrounding material(s). The filled dielectric material forms a waveguide between a microlens and the sensor element, and achieves total reflection to imaging light entered from an object to be imaged. Other requirements such as focal length of the microelens or thickness from the microlens to the sensor element can be relaxed without sacrificing imaging efficiency and quality. In one example, the filled dielectric material in the trench 150 has a refractive index higher than that of the ILD 140.

The filled material in the trench 150 includes silicon oxide deposited by various techniques such as undoped silica glass (USG), silicon oxide from silane ($SiH_4$) by plasma enhanced CVD, silicon oxide from tetraethoxysilane (TEOS) by plasma enhanced CVD, or high density plasma (HDP) CVD, spin-on glass, or combinations thereof. The filled material in the trench 150 may alternatively include doped oxide such as fluorinated silica glass, carbon doped silicate (SiCOH), or other suitable material such as other transparent glass. The filling material in the trench 150 may have a multi-film structure.

The method 200 may proceed to step 250 by applying a planarizing process to the filling material in the trench 150 and over the ILD 140 to planarize the semiconductor device 100 and remove excessive filling material. The planarizing process may include an etch back, CMP, or combinations thereof.

The method 200 may proceed to step 260 by forming a passivation layer on ILD 140 and MLI 130 to substantially cover the semiconductor device and seal the device from moisture and other contamination. In one example, the passivation layer may include a silicon oxide layer 160 disposed on ILD 140 and the filled trench 150, and a silicon nitride layer 170 on the silicon oxide layer 160 for enhanced passivation and adhesion.

Figure 4:
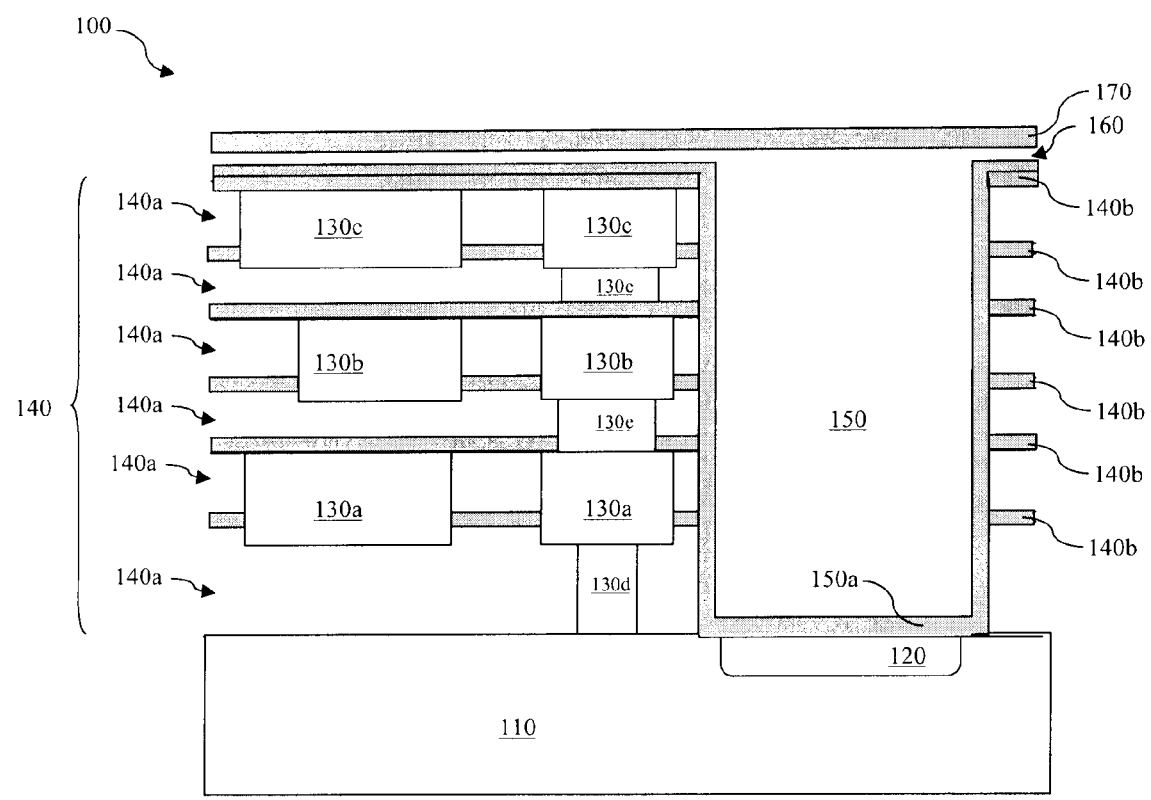
FIG. 4 illustrates a sectional view of another embodiment of a semiconductor device constructed according to aspects of the present disclosure.

Semiconductor device 100 and the method 200 making the same may have different variations. FIG. 4 illustrates a sectional view of the semiconductor device 100 in another embodiment. The trench 150 further includes a lining layer 150a. The lining layer 150a is substantially formed on sidewalls of the trench 150 and may be additionally formed on the bottom of the trench. The lining layer 150a may include nitrogen-containing materials, such as silicon nitride, silicon oxynitride, or other suitable materials. The lining layer 150a may be formed by a CVD process or other proper method after the formation of the trench 150 at step 230 and before the filling of the trench 150 at step 240. The lining layer 150a may have a thickness ranging between about 50 angstrom and 500 angstrom, and may have a multi-film structure. The lining layer 150a provides a sealing effect for eliminating moisture and other contamination from MLI 130, and/or a reflection function to control imaging light toward the sensor element for higher imaging efficiency and less interference with other functional units such as other sensor elements in the semiconductor device. In one embodiment, the filled dielectric material in the lined trench has a refractive index higher than that of the lining layer 150a. In another embodiment, the lining layer 150a has a refractive index higher than those of the ILD layer 140. In another embodiment, the lining layer 150a has a refractive index higher than that of the IMD layer 140a. A total reflection is achieved by the filled dielectric material and the lining layer. For such purpose, the filled dielectric material and the lining layer may utilize various materials including different materials or a same material with fabrication techniques, different processing parameters, different types of dopants, and/or different doping levels. For example, above mentioned a CVD method may be implemented to form both the lining layer and the filled dielectric material by dynamically controlling the processing temperature to achieve refractive index change from the lining layer to the filled dielectric layer. In another example, the filled dielectric material may include boron-doped silicate formed by a CVD method. In another embodiment, the lining layer or the ILD may utilize a low-k material.

Thus, the present disclosure provides an image sensor semiconductor device. The device includes a sensor element disposed in a semiconductor substrate; an inter-level dielectric (ILD) disposed on the semiconductor substrate; and a trench disposed in the ILD, overlying and enclosing the sensor element, and filled with a first dielectric material.

In some embodiments, the trench is further lined with a second dielectric material. The first dielectric material may include a dielectric material having a refractive index higher than that of the second dielectric material. The second dielectric material may include a nitrogen-containing material. The second material may have a thickness ranging between about 50 angstrom and 500 angstrom.

In some embodiments, the first dielectric material includes a dielectric material transparent to visible light from an object to be imaged toward the sensor element. The visual light may have a wavelength ranging from about 300 to 800 nm. The first dielectric material may include a dielectric material having a refractive index higher than that of the ILD.

In some embodiments, the first dielectric material includes silicon oxide. The first dielectric material may include a multi-film structure. The first dielectric material may be in contact with the sensor element. The ILD may include a fluoride-doped silicate glass (FSG). The ILD may include a carbon doped silicon oxide.

In some embodiments, the sensor element includes complementary metal-oxide-semiconductor (CMOS) image sensor. The sensor element may include charge-coupled device sensor. The sensor element may include an active pixel sensor. The sensor element may include a passive pixel sensor. The sensor element may be within the trench with an offset at least about 0.1 micron in a top view. The device may further include a plurality of metal features disposed in the ILD and each having a critical dimension substantially less than about 0.25 micron. A dimension of the sensor element may have a range between about 0.5 micron to 5 micron.

The present disclosure also provides a method of fabricating a semiconductor device. The method includes forming a sensor element in a semiconductor substrate; forming an inter-level dielectric (ILD) on the semiconductor substrate and multilevel interconnects (MLI) disposed the ILD; forming an opening in the ILD, wherein the opening encloses the sensor element; filling the opening using a dielectric material; and applying a planarizing process to the dielectric material in the opening.

In some embodiments, the method further include forming a liner in the opening before the filling of the opening. The filling of the opening may include utilizing a dielectric material having a refractive index higher than that of the liner. In other embodiment. The filling of the opening include utilizing a dielectric material having a refractive index higher than that of the ILD.

In another embodiment, the image sensor semiconductor device includes a sensor element disposed in a semiconductor substrate; an inter-level dielectric (ILD) disposed on the semiconductor substrate; and a trench disposed in the ILD, overlying and contacting the sensor element, and filled with a first dielectric material.

In some embodiments, the first dielectric material includes a material transparent to imaging light and configured as a waveguide to the imaging light. The first dielectric material may include a high refractive index material being surrounded by a material of a lower refractive index utilizing a total reflection to imaging light. The first dielectric material may include a glass.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An image sensor semiconductor device, comprising:
   a sensor element disposed in a semiconductor substrate;
   a multilayer interconnect (MLI) with a plurality of layered metal features disposed on the semiconductor substrate;
   a plurality of inter-metal dielectric (IMD) layers disposed on the semiconductor substrate with an etch stop layer disposed between adjacent IMD layers; and
   a trench disposed through the plurality of IMD layers and the etch stop layer, the trench overlying and completely enclosing the sensor element, the trench being sized to have walls offset from the sensor element when viewed from the top, the offset extending to a depth at least flush with the sensor element, the trench being filled with a first dielectric material.

2. The device of claim 1, wherein the trench is further lined with a second dielectric material.

3. The device of claim 2, wherein the first dielectric material comprises a dielectric material having a refractive index higher than that of the second dielectric material.

4. The device of claim 2, wherein the second dielectric material comprises a nitrogen-containing material.

5. The device of claim 2, wherein the second material has a thickness ranging between about 50 angstrom and 500 angstrom.

6. The device of claim 1, wherein the first dielectric material comprises a dielectric material transparent to visible light from an object to be imaged toward the sensor element.

7. The device of claim 6, wherein the visible light have a wavelength ranging from about 300 to 800 nm.

8. The device of claim 1, wherein the first dielectric material comprises a dielectric material having a refractive index higher than that of the IMD.

9. The device of claim 1, wherein the first dielectric material comprises silicon oxide.

10. The device of claim 1, wherein the first dielectric material comprises a multi-film structure.

11. The device of claim 1, wherein the first dielectric material is in contact with the sensor element.

12. The device of claim 1, wherein the IMD comprises a fluoride-doped silicate glass (FSG).

13. The device of claim 1, wherein the IMD comprises a carbon doped silicon oxide.

14. The device of claim 1, wherein the sensor element comprises complementary metal-oxide-semiconductor (CMOS) image sensor.

15. The device of claim 1, wherein the sensor element comprises charge-coupled device sensor.

16. The device of claim 1, wherein the sensor element comprises an active pixel sensor.

17. The device of claim 1, wherein the sensor element comprises a passive pixel sensor.

18. The device of claim 1, wherein the sensor element is within the trench with the offset being at least about 0.1 micron in a top view.

19. The device of claim 1, wherein the plurality of layered metal features are disposed in the IMD and each has a critical dimension substantially less than about 0.25 micron.

20. The device of claim 1, wherein a dimension of the sensor element has a range between about 0.5 micron to 5 micron.

21. The device of claim 1, further comprising a passivation layer over the plurality of IMD layers, the etch stop layer, and the trench that seals the device from moisture, the trench extending from the sensor element through the plurality of IMD layers and the etch stop layer to the passivation layer.

22. An image sensor semiconductor device, comprising:
   a sensor element disposed in a semiconductor substrate;
   a multilayer interconnect (MLI) with a plurality of layered metal features disposed on the semiconductor substrate;
   a plurality of inter-metal dielectric (IMD) layers disposed on the semiconductor substrate with an etch stop layer disposed between adjacent IMD layers; and
   a trench disposed through the plurality of IMD layers and the etch stop layer, overlying and contacting the sensor element, the trench being sized to have walls offset from the sensor element so as to completely enclose the sensor element when viewed from the top, the offset extending to a depth at least flush with the sensor element, the trench being filled with a first dielectric material.

23. The device of claim 22, wherein the first dielectric material comprises a material transparent to imaging light and configured as a waveguide to the imaging light.

24. The device of claim 22, wherein the first dielectric material comprises a high refractive index material being surrounded by a material of a lower refractive index utilizing a total reflection to imaging light.

25. The device of claim 24, wherein the first dielectric material comprises a glass.

26. The device of claim 22, further comprising a passivation layer over the plurality of IMD layers, the etch stop layer, and the trench that seals the device from moisture, the trench extending from the sensor element through the plurality of IMD layers and the etch stop layer to the passivation layer.

* * * * *